United States Patent

Ilg et al.

[11] Patent Number: 5,807,792
[45] Date of Patent: Sep. 15, 1998

[54] UNIFORM DISTRIBUTION OF REACTANTS IN A DEVICE LAYER

[75] Inventors: Matthias Ilg, Fishkill; Markus Kirchhoff, Wappingers Falls, both of N.Y.; Christoph Werner, Moosach, Germany

[73] Assignee: Siemens Aktiengesellschaft, Munich, Germany

[21] Appl. No.: 768,826

[22] Filed: Dec. 18, 1996

[51] Int. Cl.⁶ .................................................. H01L 21/316
[52] U.S. Cl. ...................... 438/758; 438/778; 438/760; 438/782; 438/784; 427/255.3; 427/255.5
[58] Field of Search .................................. 438/782, 784, 438/783, 760, 758, 778; 427/255.3, 255.5; 148/DIG. 133

[56] References Cited

U.S. PATENT DOCUMENTS

| | | | |
|---|---|---|---|
| 4,976,996 | 12/1990 | Monkowski et al. | 427/255.5 |
| 5,490,114 | 2/1996 | Butler et al. | 365/189.05 |
| 5,532,970 | 7/1996 | Butler et al. | 365/230.05 |
| 5,539,349 | 7/1996 | Roy | 327/276 |
| 5,559,752 | 9/1996 | Stephens, Jr. et al. | 365/233 |

OTHER PUBLICATIONS

Tedder, Laura et al., "Catalytic Effect of Phosphine on the Deposition of Phosphosilicote Glass from Tetratoxysilane", Appl. Phys. Lett., 62 (7), 15 Feb. 1993.

Tischler et al., "Growth and Characterization of Compound Semiconductors by Atomic Layer Epitaxy", Journal of Crystal Growth, 77 (1986) 89–94, 1986.

Sumakeris, J. et al., "Layer–by–Layer Epitaxial Growth of GaN at Low Temperatures", 2194 Thin Solid Films 225 (1993) Mar. 25, No. ½, Lausanne, CH, 1993.

*Primary Examiner*—Charles L. Bowers, Jr.
*Assistant Examiner*—Matthew Whipple
*Attorney, Agent, or Firm*—Dexter K. Chin

[57] ABSTRACT

A method and apparatus for forming a multi-constituent device layer on a wafer surface are disclosed. The multi-constituent device layer is formed by flowing a first chemistry comprising a first constituent and a second chemistry comprising a second constituent via a segmented delivery system into a reaction chamber. The reaction chamber comprises a susceptor for supporting and rotating the wafers. The segmented delivery system comprises alternating first and second segments into which the first and second chemistries, respectively, are flowed. The first segments comprise an area that is greater than an area of the second segments by an amount sufficient to effectively reduce the diffusion path of the first constituent. Reducing the diffusion path of the first constituent results in a more uniform distribution of the first constituent within the device layer.

28 Claims, 8 Drawing Sheets

← 0-20 rpm

UNIFORM DISTRIBUTION OF REACTANTS IN A DEVICE LAYER

FIELD OF INVENTION

The invention generally relates to device fabrication and, in particular, to the formation of multi-constituent layers having substantially uniform distribution of the constituents.

BACKGROUND OF INVENTION

In device fabrication, device structures, such as transistors, capacitors, and resistors, are formed on a substrate or wafer. These device structures are then interconnected to achieve a desired electrical function. Formation of the device structures typically comprises producing and patterning layers of insulating, semiconducting, and conducting materials on the substrate. Techniques for forming layers on a substrate include chemical vapor deposition (CVD), such as those described in Wolf et al., *Silicon Processing for the VLSI Era*, Vol. I, Lattice Press (1986); and Kern et al., *IEEE Trans. Electron-Devices*, ED-26 (1979) which are herein incorporated by reference for all purposes.

Typically, CVD techniques are performed in a reactor comprising a susceptor, heater, and chemistry delivery system. To increase the throughput of the reactor, the susceptor generally is designed to support a plurality of wafers. The chemistry delivery system flows a chemistry into the reaction chamber. The chemistry comprises one or more constituents that are to be deposited on the surface of the wafers and from which the layer is formed. (In some cases, the constituents are derived from the chemistry that is flowed into the reactor, while in others, they are derived in situ by, for example, reacting with other introduced chemistries) Typically, the chemistry includes a carrier agent to aid in flowing the constituents into the reaction chamber. The carrier agent, in some applications, may also serve other functional purposes, such as $O_2$ which acts as an oxidation agent. The heater is used to heat the reaction chamber to reaction conditions, causing the chemistry to react with the wafer surface as the chemistry is flowed therein. The reaction decomposes the chemistry, yielding the constituents that are to be deposited to form the layer. The constituents then chemically combine with the surface to form the layer. The reaction temperature and chemistry, or course, depend on the type of layer that is to be formed.

In some applications, formation of the layer comprises at least two constituents (multi-constituent). Such multi-constituent layers may be formed by flowing at least two chemistries (multi-chemistry), each comprising at least one constituent, into the reaction chamber. For example, a first chemistry comprising a first constituent and carrier agent and a second chemistry comprising a second constituent and a carrier agent are flowed into the reaction chamber and reacted to yield the constituents for forming the multi-constituent layer. A segmented delivery system is employed to deliver the different chemistries into the reaction chamber. The use of segmented delivery system to form multi-constituent layers is desirable because it decouples process parameters, enabling easier process control.

In a conventional segmented delivery system, the reaction chamber is divided into sectors of equal size. The segmented delivery system delivers the different chemistries to alternating sectors of the reaction chamber. However, the use of segmented delivery system results in a non-uniform distribution of one or more constituents in the reaction chamber, resulting in non-uniformities among the wafers in the chamber. Non-uniformities also exist in the layer within the individual wafers. Although a certain amount of non-uniformity is tolerable, exceeding this amount can be detrimental for process yields.

From the above discussion, it is apparent that there is a need for an improved technique and system for forming layers to achieve a substantially uniform distribution of the material throughout the wafer.

SUMMARY OF INVENTION

The invention relates to the formation of a multi-constituent device layer on a wafer surface. The device layer comprises at least first and second constituents. The layer is formed in a reaction chamber comprising a susceptor capable of supporting at least one wafer and alternating first and second segments. A wafer is placed on the susceptor and rotated. A first chemistry comprising the first constituent and a second chemistry comprising the second constituent are flowed into the first and second segments, respectively. In accordance to one embodiment, the first segments comprise an angular area that is greater than an angular area of the second segments by an amount sufficient to effectively reduce the diffusion path of the first constituent. Reducing the diffusion path of the first constituent results in a more uniform distribution of the first constituent within the device layer.

DETAIL DESCRIPTION OF THE INVENTION

The present invention relates generally to device fabrication and, particularly, to the formation of layers having a substantially uniform distribution of constituents derived from more than one chemistry. For purposes of illustration, the invention is described in the context of forming a borophosposilicate glass (BPSG) layer. However, the invention is significantly broader and extends to the fabrication of device layers in general.

Figure 1:
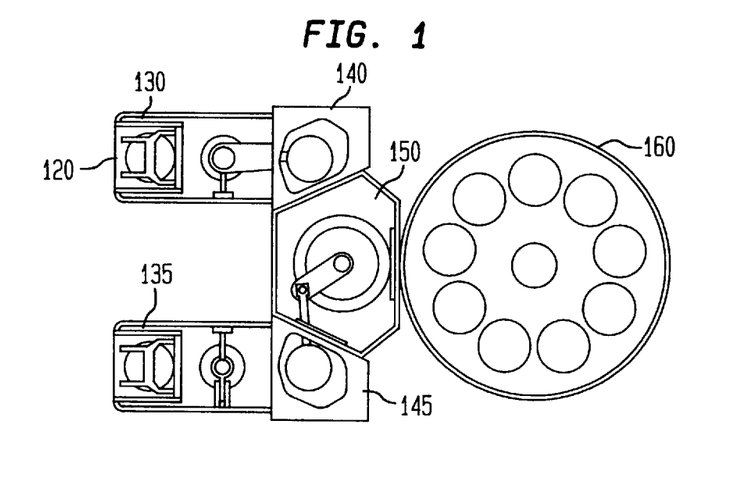
FIG. 1 shows a conventional CVD reactor.

Before discussing the invention, a description of conventional CVD reactor used for forming layers is provided. Referring to FIG. 1, a simplified top view of a conventional CVD reactor 110 is shown. Such reactor, for example, include the Lam Integrity DSM 9800 system produced by Lam Research, Inc. in Fremont, Calif. As shown, reactor 110 comprises wafer cassette storage bays 130 and 135, loadlock units 140 and 145, transfer chamber 150, and reaction chamber 160. The Lam Integrity DSM 9800 is described in U.S. Pat. No. 4,976,996 issued to Monkowski et al., which is herein incorporated by reference for all purposes. Cassette storage bays each store a cassette, such as those used for holding and storing a plurality wafers in conventional device fabrication. The wafers in the cassettes are transferred to the respective load lock units by wafer transfer arms 131 and 132. Transfer chamber 150 includes a wafer loading arm 151. The wafer loading arm removes a wafer from either loadlock 140 or loadlock 145 and places it in a wafer slot 161 of a susceptor 165 in the reaction chamber. Illustratively, the susceptor comprises nine wafer slot. Wafers are loaded into the other slots by rotating the susceptor to the appropriate position.

Figure 2:
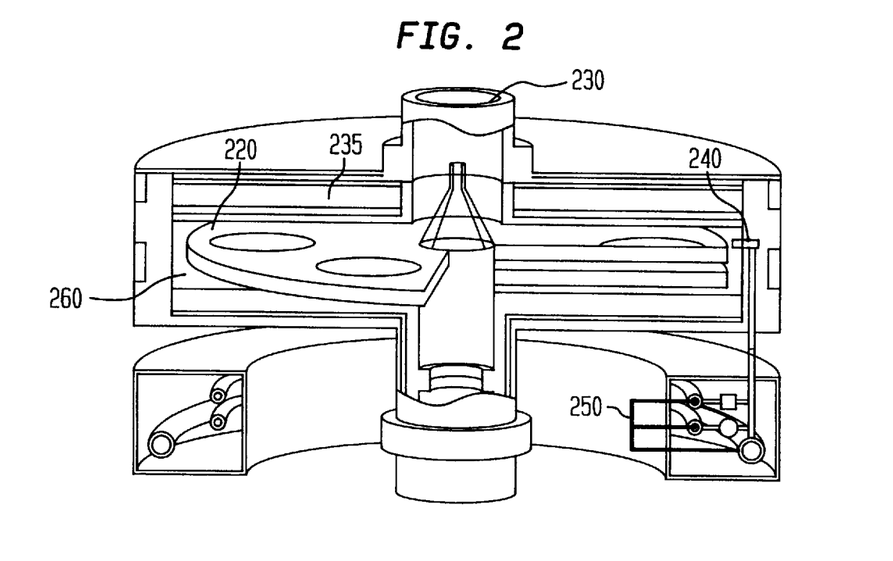
FIG. 2 shows a reaction chamber of the conventional CVD reactor in detail.

FIG. 2 shows the reaction chamber 160 in greater detail. As shown, the reaction chamber comprises a susceptor 220 in a reaction area 260 of the chamber. The susceptor includes a plurality of slots for placement of a wafer therein. Typically, the slots are depressed such that the top surface of the wafer, when placed therein, is substantially planar with the surface of the susceptor. The substantially planar surface facilitates the flow of chemistry. A plurality of injectors 250 are located at the circumference of the reaction chamber. Connected to the injectors are a plurality of chemistry feed lines 250. The number of feed lines depend on the number of different types of materials used for forming the layer. The materials are mixed and delivered into the reaction area of the chamber by the injectors. Excess materials and by-products of the reaction exit the reaction chamber through an exhaust vent 230 located at the center of the chamber. As such, the direction of the flow of the chemistry is from injectors toward the center. Alternatively, reversing the direction of chemistry flow is also useful. Reversing the flow is achieved by locating the injectors at the center of the chamber and the exhaust vents at the circumference of the chamber.

Figure 3:
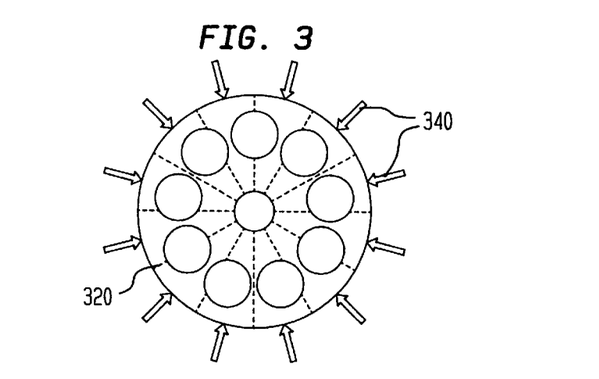
FIG. 3 shows a segmented chemistry delivery system of the conventional CVD.

FIG. 3 shows a top view of a segmented delivery system of the conventional CVD reactor. The reaction chamber 320 is divided into a plurality of sectors having equal area. At the circumference of the reactor in each sector, a delivery injector 340 (depicted by an arrows) is provided. Illustratively, the reaction chamber comprises 12 sector. The injectors are used to flow the appropriate chemistry into the reaction chamber. The injectors are configured such that the chemistry is flowed in a linear path from the injectors toward the center of the susceptor, i.e., center of the reaction chamber. The susceptor is rotated, enabling the chemistry to contact the surface area of the wafer.

Typically, two chemistries are used to form BPSG. The first chemistry comprises $TEB/TEOS/O_2/N_2$. The TEOS (tetraethoxysilane) is the source of silicon, TEB (triethyl borate) provides the source of boron (B) dopant atoms, and $O_2$ and $N_2$ are carrier gases. The second chemistry is a phosphine chemistry comprising $PH_3/O_2/N_2$. $PH_3$ (phosphine) provides the source of phosphorus (P) dopant atoms, and $O_2$ and $N_2$ are oxidation and carrier gases.

Figure 4:
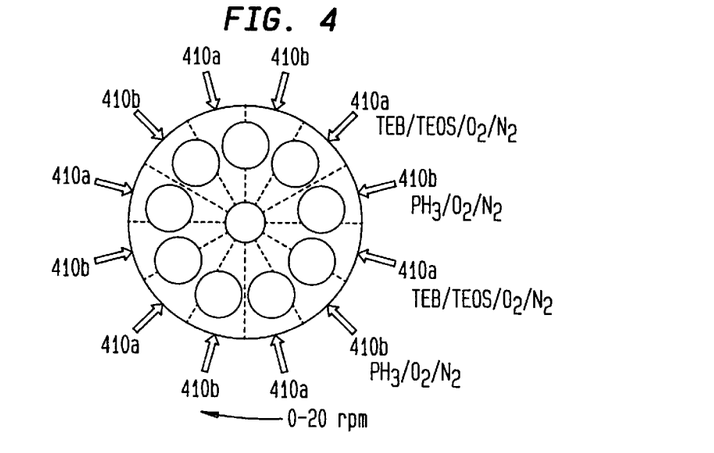
FIG. 4 shows a conventional segmented chemistry delivery system for forming a BPSG layer.

Conventionally, the two chemistries are flowed into the reaction chamber via alternating injectors. Referring to FIG. 4, for example, the $TEB/TEOS/O_2/N_2$ chemistry is delivered by injectors 410a and the $PH_3/O_2/N_2$ chemistry is delivered by injectors 410b. The formation of the BPSG layer is achieved using conventional process conditions, such as those described in Tedder et al., Appl. Phys. Lett. 62, p. 699 (1993), which is herein incorporated by reference for all purposes. Typical concentration of B and P for the BPSG layer is about 3–6 wt % each. The temperature of the reaction chamber is about 650°–900° C., preferably about 750°–850° C. The pressure in the reaction chamber is about 100–10,000 mTorr, preferably about 1,000–5,000 mTorr. The susceptor is rotated at less than or equal to about 20 revolutions per minutes (rpm), preferably less than or equal to about 5 rpm.

Figure 5:
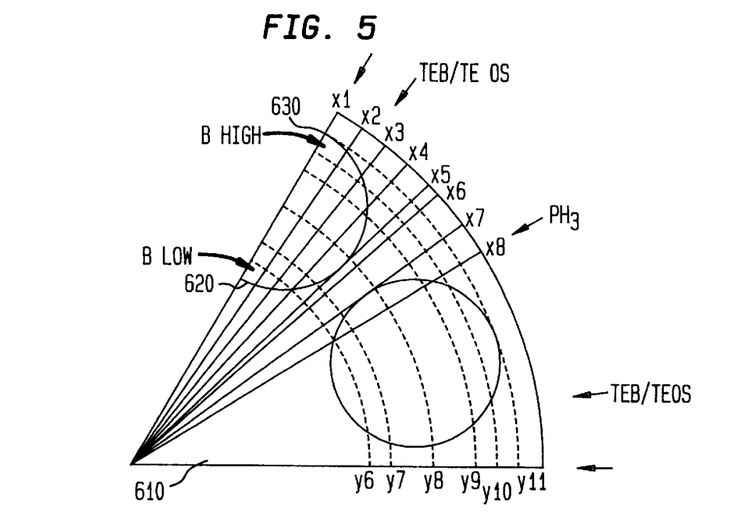
FIG. 5 shows a 60° section of a susceptor from a conventional segmented delivery system.

Referring to FIG. 5, about a 60° section of susceptor 610 of a segmented delivery system is shown. As shown, the section comprises injectors which flow TEOS and phosphine chemistries alternately. Conventional segmented delivery system creates non-uniformities in the thickness and distribution of the B dopants in the BPSG layer. Typically, the concentration of the B dopants is relatively low at a portion 620 of the wafer facing the center of the reactor and increases with increasing distance from the reactor center. In other words, the concentration of B increases as the location of the wafer is closer to the injectors. Generally, portion 620 is referred to as the notch portion of the wafer. The notch acts as a marker for positioning the wafer on the susceptor. Portion 630 of the wafer, which is opposite to the notch, is referred to as the anti-notch portion.

Boron controls the essential gap fill properties of the BPSG layer. Variations in the concentration of B within a wafer of greater than an acceptable range adversely affect the gap fill properties of BPSG. In conventional processes for forming BPSG, variances in B concentration within the wafer of greater than 1 wt % have been observed. Greater than about 1 wt % variances in B concentration undesirably causes voids and/or surface crystallization to form in the BPSG layer. Additionally, the dopant concentration affects the etch rate of the layer. Variations in the dopant concentration causes variances in the etch rate for different portions of the wafer. As such, the variation in the concentration of B within the wafer is kept within the acceptable range to effectively form the BPSG layer without substantially any voids and/or surface crystallization. Also, by keeping the variation in the concentration of B within the acceptable range, variations in the etch rate at different portions of the wafer is reduced. In one embodiment, the B concentration variance within the wafer is $\leq$ to about 1 wt %. Preferably, the B concentration variance within the wafer is $\leq$ to about 0.75 wt %, more preferably, the B concentration variance within the wafer is $\leq$ to about 0.6 wt %, and most preferably, the B concentration variance within the wafer is $\leq$ to about 0.5 wt %.

It has been determined that one of the underlying causes for variations in B concentration within the wafer is the difference in diffusivity of the molecules in the $TEB/TEOS/O_2/N_2$ chemistry used. Another underlying cause of the non-uniformity in the concentration of B in the layer relates to the chemical mechanism or reaction chemistry used in forming the BPSG layer.

Figure 6A:
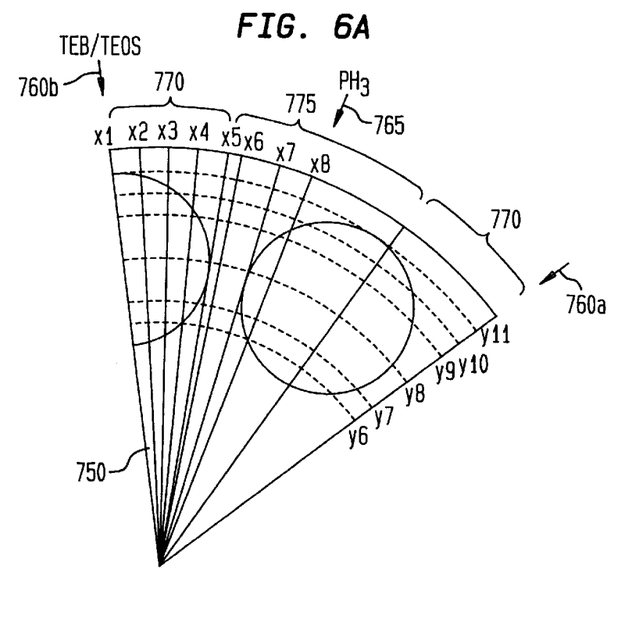
FIGS. 6a–b show the TEOS/TEB ratio as a function of angular position in a conventional CVD reactor.

The problems caused by the difference in diffusivity of the molecules in the $TEB/TEOS/O_2/N_2$ chemistry will now be discussed. Referring to FIG. 6a, the diffusivity of the molecules TEB/TEOS/$O_2$/$N_2$ chemistry is shown. The diffusion rate of the TEB molecules is higher than the TEOS molecules. The higher diffusion rate of the TEB molecules causes the TEB molecules to separate from the slower TEOS molecules and diffuse more quickly in the lateral direction into the neighboring phosphine sectors. As a result, the TEB/TEOS ratio dramatically increases in the phosphine sectors. Furthermore, the TEB/TEOS ratio increases as the portion of the wafer is closer towards the outer circumference of the reactor, i.e., towards the anti-notch portion of the wafer. Consequently, the B concentration is much higher in the phosphine sectors closer to the injectors than at the notch portion of the wafer.

FIG. 6a shows an exemplary section 750 of a reaction chamber having twelve sectors of about 30° each. As shown, section 750 is about 60° and comprises injectors 760a–b and 765. Injectors 760a–b deliver TEB/TEOS/$O_2$/$N_2$ chemistry into the chamber; injector 765 delivers $PH_3$/$O_2$/$N_2$ into the chamber. As such, areas 770 of the section represent TEB/TEOS/$O_2$/$N_2$ sectors and area 775 is the $PH_3$/$O_2$/$N_2$ sector. A theoretical gas flow simulation of the two chemistries was conducted on a Phoenics CVD 2.1 simulator, London, England. The simulation emulated the following process conditions:

| | |
|---|---|
| Pressure in the reaction chamber | 1 Torr |
| $PH_3$/$O_2$/$N_2$ injectors | 6.25 slm $N_2$ |
| TEOS/TEB/$O_2$/$N_2$ injectors | 2.5 slm $N_2$ |
| | 7.15 ml/min TEOS |
| | 1.85 ml/min TEB |
| TEOS diffusivity | $1.1 \times 10^{-2}$ m$^2$/sec |
| TEB diffusivity | $1.6 \times 10^{-2}$ m$^2$/sec |
| Temperature in the reaction chamber | 830° C. |
| Susceptor rotation | 3.5 rpm | slm: standard liters per minute (gas)
ml/mm: milliliters per minute (liquid injection)

Figure 6B:
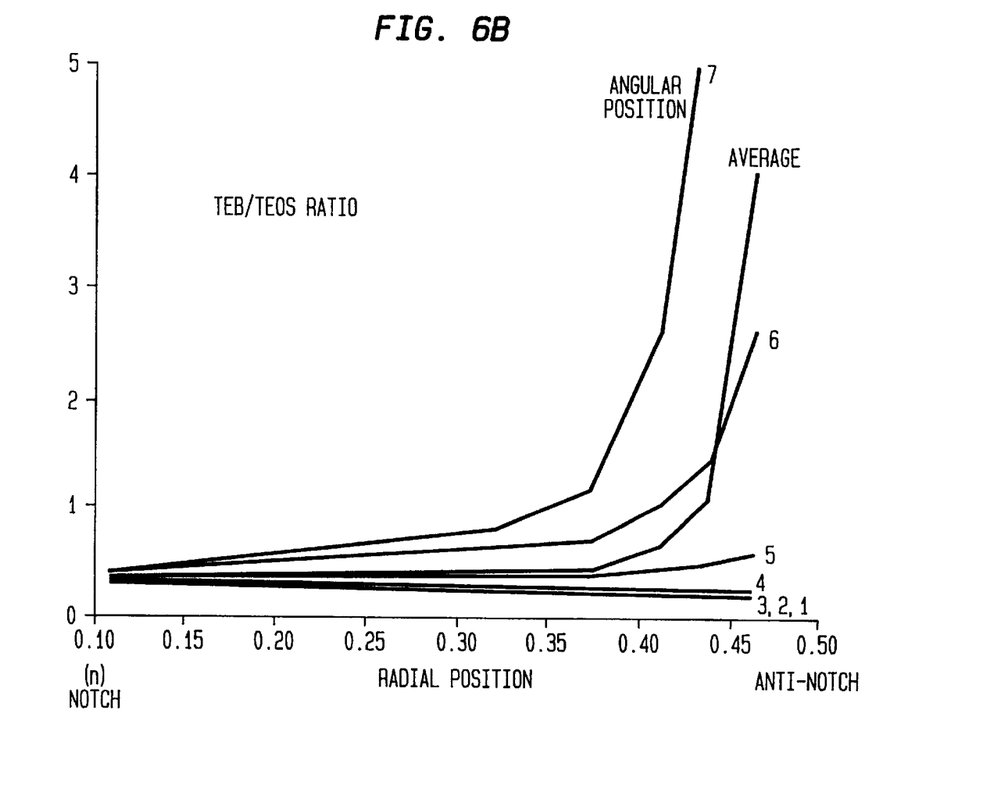

FIG. 6b is a plot of TEB/TEOS ratios measured at angular positions x1–x8 in section 750 (see FIG. 6a) with respect to its radial position (in meters from the center of the reaction chamber). Lines 1–8 correspond to the TEB/TEOS ratio measured at angular position x1–x8, respectively. Angular positions x1–x8 represent locations in the reaction chamber beginning at the TEB/TEOS sector and moving toward the phosphine sector. As shown by lines 1–4, the TEB/TEOS ratio remains approximately constant in the TEOS/TEB sectors. However, lines 5–8 show that as the angular position moves toward the phosphine sector and as the radial position moves from the center toward the circumference of the reaction chamber, the TEOS/TEB ratio increases. The increase in TEOS/TEB ratio peaks at about the circumference of the reaction chamber near about the center of the phosphine sector. This phenomenon is caused by different diffusion rate of TEB and TEOS molecules. In particular, TEB diffuses faster than TEOS molecules. As a result, TEB separates and diffuses into the phosphine sector without the TEOS molecules.

The difference in the diffusion rate of the TEOS and TEB molecules and the resulting separation of the two type of molecules create a non-uniform distribution of B in the BPSG layer. In accordance with the invention, the separation of the TEOS and TEB molecules is reduced to produce a BPSG layer with a more uniform distribution of B. It has been determined that between two different types of molecules with different diffusion rates, the separation of the two types of molecules will be more pronounced as the diffusion path increases. Conversely, the separation of the two types of molecules with different diffusion rates will be less as the diffusion path decreases. Thus, shortening the diffusion path of the two different molecules concomitantly reduces the separation between the two molecules.

In accordance with the invention, an improved BPSG layer is formed by shortening the diffusion path of the TEB/TEOS/$O_2$/$N_2$ chemistry to reduce the separation between TEB and TEOS molecules therein. Reducing the diffusion path facilitates more uniform distribution of B in the BPSG layer.

Figure 7:
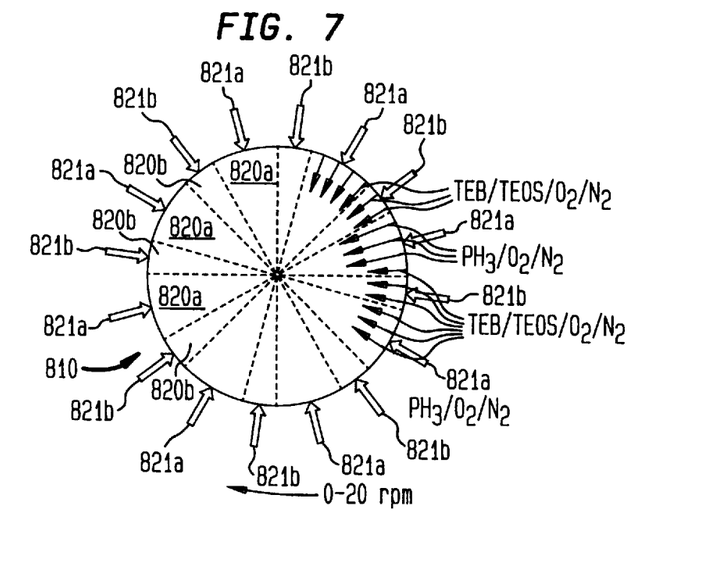
FIG. 7 shows a reaction chamber with a segmented delivery system which shortens the diffusion path of one of the chemistries.

FIG. 7 shows a simplified diagram of a reaction chamber from a CVD reactor having the diffusion path of the TEB/TEOS/$O_2$/$N_2$ chemistry shortened. Illustratively, the reaction chamber comprises a circular type susceptor 810 for supporting a plurality of wafers in a circular configuration (not shown). The reaction chamber is divided into a plurality of sectors 820a and 820b. The exemplary reaction chamber is divided into 12 sectors. Sectors 820a and 820b comprise injectors 821a and 821b, respectively, for flowing chemistries into the reaction chamber. Injectors 821a flow TEB/TEOS/$O_2$/$N_2$ chemistry; injectors 821b flow $PH_3$/$O_2$/$N_2$ chemistry.

As shown, the reaction chamber comprises TEB/TEOS/$O_2$/$N_2$ sectors 820a whose size is greater than that of the $PH_3$/$O_2$/$N_2$ sectors 820b. Providing TEB/TEOS/$O_2$/$N_2$ sectors that are larger than the $PH_3$/$O_2$/$N_2$ sectors decreases the diffusion path of the TEB/TEOS/$O_2$/$N_2$ chemistry. It can be seen from FIG. 7 that, because sectors 820b are reduced, the TEB molecules have a much shorter lateral distance to diffuse before meeting the TEB molecules from the next closest 820a sectors than if sectors 820a and 820b were equal. The shorter diffusion path reduces the separation between the TEB and TEOS molecules. Thus, a more uniform distribution of B results in the BPSG layer.

The area by which the TEB/TEOS/$O_2$/$N_2$ sectors is greater than the $PH_3$/$O_2$/$N_2$ sectors is sufficient to effectively decrease the diffusion path of the TEB/TEOS/$O_2$/$N_2$ chemistry to produce a BPSG layer having B concentration variance within the wafer of $\leq$ to about 1.0 wt % without adversely affecting the formation of the BPSG layer. For example, the size of the $PH_3$/$O_2$/$N_2$ sectors should be sufficient to adequately allow the incorporation of phosphorus in the BPSG layer. In addition, the larger TEB/TEOS/$O_2$/$N_2$ sectors results in a greater proportion of TEB/TEOS/$O_2$/$N_2$ chemistry to be injected into the reaction chamber. This causes the B to P ratio to be higher than that desired. To compensate for the increase of B to P ratio, the pressure of the $PH_3$/$O_2$/$N_2$ injectors is increased. Increasing the pressure of the $PH_3$/$O_2$/$N_2$ increases the amount of $PH_3$/$O_2$/$N_2$ chemistry in the reaction chamber, thereby reducing the B to P ratio to within the desired level.

Preferably, the area of the TEB/TEOS/$O_2$/$N_2$ sectors is greater than the area of the $PH_3$/$O_2$/$N_2$ sectors by an amount sufficient to effectively decrease the diffusion path of the TEB/TEOS/$O_2$/$N_2$ chemistry to effectively produce a BPSG layer having B concentration variance within the wafer of $\leq$ to about 0.75 wt % without adversely affecting the formation of the BPSG layer. More preferably, the area of the TEB/TEOS/$O_2$/$N_2$ sectors is greater than the area of the $PH_3$/$O_2$/$N_2$ sectors by an amount sufficient to effectively decrease the diffusion path of the TEB/TEOS/$O_2$/$N_2$ chemistry to produce a BPSG layer having B concentration variance within the wafer of $\leq$ to about 0.6 wt % without adversely affecting the formation of the BPSG layer. Most preferably, the area of the TEB/TEOS/$O_2$/$N_2$ sectors is greater than the area of the $PH_3$/$O_2$/$N_2$ sectors by an amount sufficient to effectively decrease the diffusion path of the TEB/TEOS/O$_2$/N$_2$ chemistry to produce a BPSG layer having B concentration variance within the wafer of ≦ to about 0.5 wt % without adversely affecting the formation of the BPSG layer.

In one embodiment, shortening the diffusion path of the TEB/TEOS/O$_2$/N$_2$ to reduce the B concentration variances within the wafer is achieved by increasing the area of the TEB/TEOS/O$_2$/N$_2$ sectors such that it is at least about 20% greater than that of the PH$_3$/O$_2$/N$_2$ sectors. Preferably, the area of the TEB/TEOS/O$_2$/N$_2$ sectors is between about 20% to 400% greater than that of the PH$_3$/O$_2$/N$_2$ sectors, more preferably between about 40% to 350%, even more preferably between about 60% to 300%, even more preferably, between about 80% to 250%, and most preferably, between about 100% to 200%.

The angular area of the sectors 820*a* is increased by, for example, expanding the flow width of injectors 821*a* such that the TEB/TEOS/O$_2$/N$_2$ chemistry flowing therefrom covers a wider area. Also, the flow width from injectors 821 bare contracted to decrease the area covered by the PH$_3$/O$_2$/N$_2$ chemistry. Alternatively, additional injectors are provided to increase the angular area of sectors 820*a*.

Figure 8:
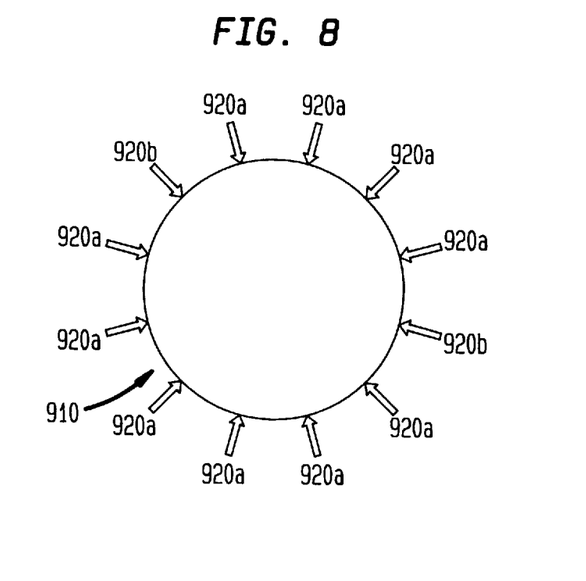
FIG. 8 shows an alternative reaction chamber with a segmented delivery system which shortens the diffusion path of one of the chemistries.

FIG. 8 shows anther embodiment of the invention which shortens the diffusion path of the TEB and TEOS molecules. The reaction chamber 910 is divided into twelve equal sectors. Injectors 920*a* and 920*b* for flowing chemistries are located at the circumference of the reaction chamber. As shown, the reaction chamber comprises more injectors for flowing the TEB/TEOS/O$_2$/N$_2$ chemistry than injectors for flowing the PH$_3$/O$_2$/N$_2$ chemistry. By dedicating more injectors for flowing the TEB/TEOS/O$_2$/N$_2$ chemistry, the area of TEB/TEOS/O$_2$/N$_2$ sectors is increased. In one embodiment, every third or greater injector is used for flowing the PH$_3$/O$_2$/N$_2$ chemistry. Illustratively, every sixth injector is used flowing the PH$_3$/O$_2$/N$_2$ into the reaction chamber. For reactor with twelve injectors, between every third to every sixth injector is used for flowing PH$_3$/O$_2$/N$_2$ chemistry.

Enlarging the area of TEB/TEOS/O$_2$/N$_2$ sectors provides additional advantages, such as, for example, increasing the deposition rate of BPSG. As previously discussed, TEOS from the TEB/TEOS/O$_2$/N$_2$ chemistry is the source of silicon. Thus, enlarging the TEB/TEOS/O$_2$/N$_2$ sectors enables a greater amount of TEOS is injected into the reaction chamber for a given time as compared to if the TEB/TEOS/O$_2$/N$_2$ and PH$_3$/O$_2$/N$_2$ were equal, which results in an increase in BPSG formation rate. Typically the rate of forming BPSG layer using a reactor with equal TEB/TEOS/O$_2$/N$_2$ and PH$_3$/O$_2$/N$_2$ sectors is about 3.5 nm/sec. Increasing the area or number of TEB/TEOS/O$_2$/N$_2$ sectors increases the formation rate of BPSG to about 4–4.5 nm/sec.

The problem relating to chemical mechanism or reaction chemistry used in forming the BPSG layer will now be discussed. Although the exact chemical mechanism that causes B non-uniformity is not clear, it appears that such non-uniformity depends on flow rate of the oxygen (O$_2$) component in the TEB/TEOS/O$_2$/N$_2$ chemistry. Oxygen flow, through experiments, has been found to be inversely related to the non-uniformity of B.

In accordance with the invention, a more uniform distribution of B is achieved by decreasing the flow rate of the O$_2$ component in the TEB/TEOS/O$_2$/N$_2$ chemistry. The O$_2$ flow rate in conventional CVD techniques for forming BPSG is about 4 slpm. In one embodiment, the flow rate of O$_2$ is < about 4 slpm. Preferably, the O$_2$ flow rate is ≦ about 3 slpm. More preferably, the O$_2$ flow rate is ≦ about 2 slpm, and most preferably, the flow rate of O$_2$ in the TEB/TEOS/O$_2$/N$_2$ chemistry is about 0. Although O$_2$ is required in used to cause oxidation of phosphine, it is provided by the PH$_3$/O$_2$/N$_2$ chemistry.

Other parameters which also affect B uniformity includes concentration of B in the chemistry and reaction temperature. The concentration of B and reaction temperature have been observed to be indirectly related to non-uniformity of the B concentration, i.e., as concentration of B increases and/or reaction temperature increase, a more uniform distribution of B results in the BPSG layer. However, these parameters are dependent on process and/or design requirements and, therefore, cannot be varied freely.

In addition, the flow rate of the TEB/TEOS/O$_2$/N$_2$ chemistry has been observed to somewhat affect the non-uniformity in B concentration in the BPSG layer. The flow rate of TEB/TEOS/O$_2$/N$_2$ chemistry is inversely related to the non-uniformity of B concentration. In one experiment, it was found that doubling the conventional TEB/TEOS/O$_2$/N$_2$ flow rate resulted in about a 10% reduction in the B gradient. Thus, increasing the TEB/TEOS/O$_2$/N$_2$ flow rate into the reaction chamber decreases the B gradient.

EXAMPLES

Example 1

Production runs of forming BPSG using conventional techniques were performed on the Lam DSM 9800. The following are the process parameters for the production runs:

| | |
| --- | --- |
| Deposition time | 320 seconds |
| Pressure | 2900 mTorr |
| Susceptor rotation rate | 5 rpm |
| TEB/TEOS | 3.5 ml/min |
| TEOS | 5.5 ml/min |
| PH$_3$ | 1.15 slm |
| N$_2$ - dil. | 3.75 slm |
| N$_2$ - main | 3 slm |
| O$_2$ | 2 slm |
| Temperature | 800° C. |

The B concentration of wafers from these runs were measured at different spatial positions on the wafer.

Figure 9:
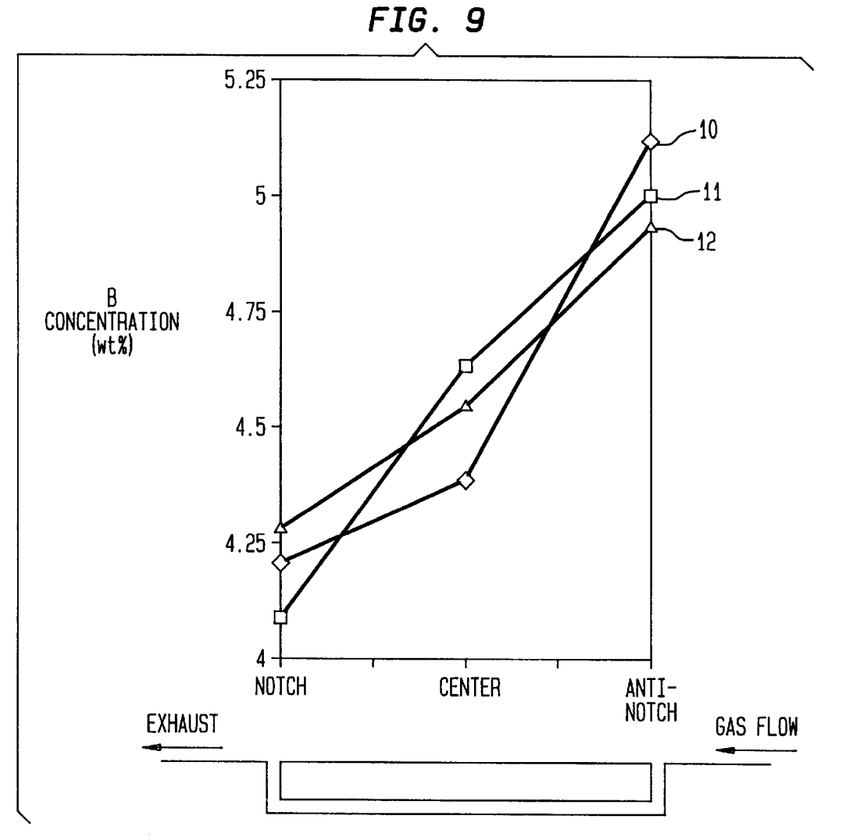
FIG. 9 is a plot of B variance within wafer from samples formed using conventional segmented delivery system.

FIG. 9 is a plot of the B concentration measurements. The gas flow and relative position of the wafer is graphically depicted below the plot. Lines 10, 11, and 12 represent B concentration measurements of three wafers from different production runs. As shown, the concentration of B is lowest at the notch portion of the wafer and largest at the anti-notch portion of the wafer. The difference in concentration at the two portion of the wafer, as shown, is about 1 wt % or greater. Such a variance in B concentration is detrimental to yields.

Figure 10:
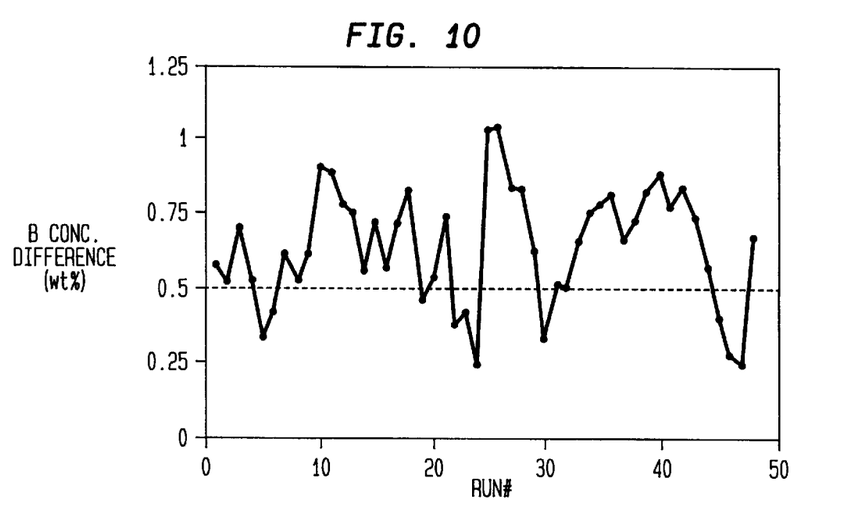
FIG. 10 is a plot of B variance within wafers from additional samples formed using conventional segmented delivery system.

FIG. 10 is a plot measuring the difference of B concentration from the notch to anti-notch portion of a wafer. The plot measured 50 wafers from different production runs. As shown, a majority of the wafers has a B concentration variance within the wafer (from notch to anti-notch) of greater than 0.5 wt %. The mean of the variances was 0.7 wt % and the maximum variance measured was 1.05 wt %.

Example 2

Figure 11A:
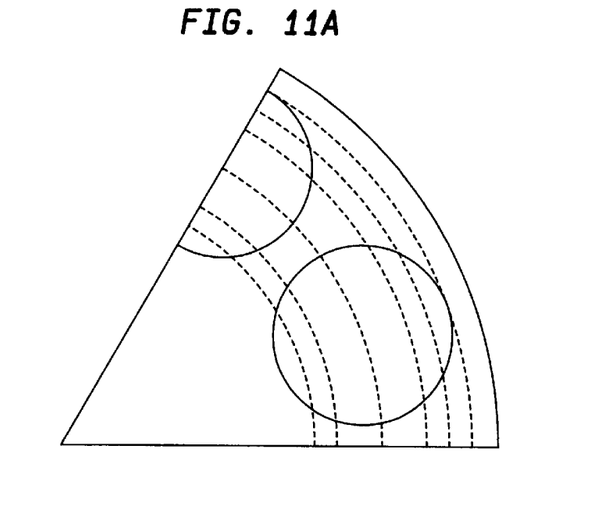
FIGS. 11a–b show the TEB/TEOS ratio of a BPSG produced by simulation using a model of a conventional segmented chemistry delivery system.

A theoretical gas flow simulation of conventional chemistries used in forming a BPSG layer was performed on Phoenics CVD 2.1 simulator from Cham, London, England. A model of a conventional reaction chamber with twelve 30° sectors was generated for the simulations. TEB/TEOS/O$_2$/N$_2$ and PH$_3$/O$_2$/N$_2$ chemistries were flowed into alternating sectors of the reaction chamber. FIG. 11a shows a 60° segment of the reaction chamber. Injector 150a–b are used to flow TEB/TEOS/O$_2$/N$_2$ chemistry and injector 155 is used to flow PH$_3$/O$_2$/N$_2$ chemistry. As shown, arcs y1–y6 represent different radial positions of the reaction chamber. The process parameters for the simulations are as follows:

| | |
|---|---|
| Pressure in the reaction | 1 Torr |
| PH$_3$/O$_2$/N$_2$ injectors | 6.25 slm N$_2$ |
| TEOS/TEB/O$_2$/N$_2$ injectors | 2.5 slm N$_2$ |
| | 7.15 ml/min TEOS |
| | 1.85 ml/min TEB |
| TEOS diffusivity | 1.1 × 10$^{-2}$ m$^2$/sec |
| TEB diffusivity | 1.6 × 10$^{-2}$ m$^2$/sec |
| Temperature in the reaction chamber | 830° C. |
| Susceptor rotation | 3.5 rpm | slm: standard liters per minute (gas)
ml/mm: milliliters per minute (liquid injection)

Figure 11B:
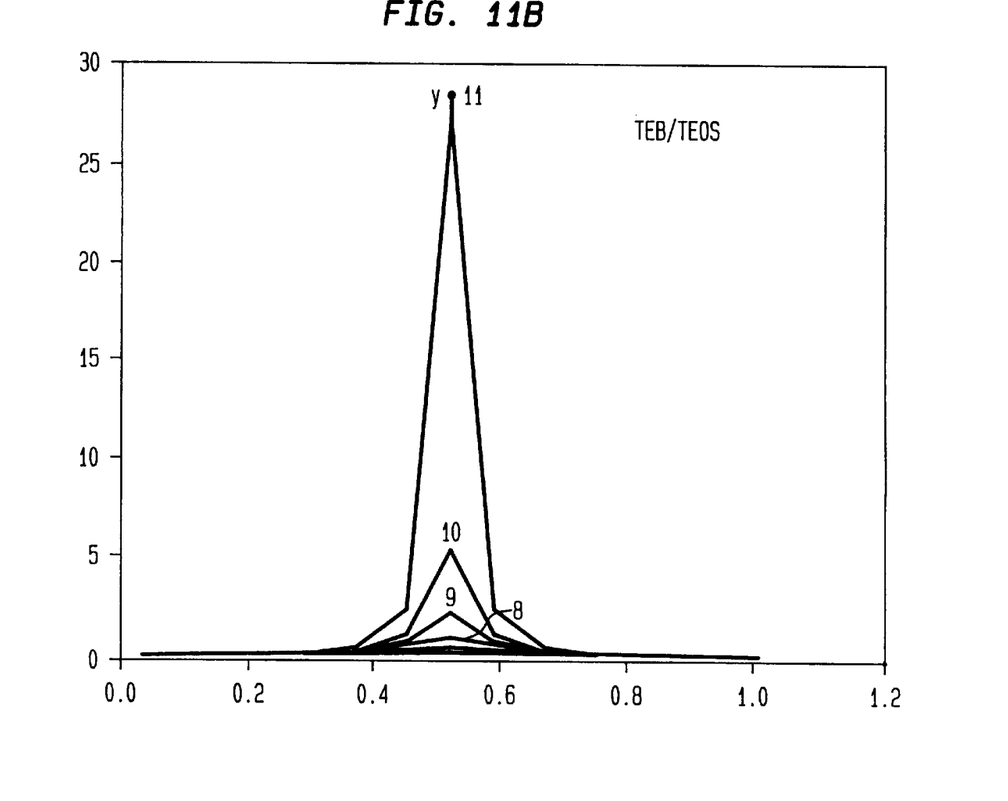

TEB/TEOS ratios were measured in different radial positions of the reactor. Referring to FIG. 11b, the TEB/TEOS ratio is plotted as a function of angular position (in radians). Lines 1–6 correspond to the arcs y1–y6 in FIG. 12a. As shown by the plot, the TEB/TEOS ratio is much lower at wafer locations closer toward the center of the chamber and increases significantly at locations near the circumference of the chamber. Plot 12b suggests that the concentration of B tends to be lower near the center of the chamber and increases towards the circumference of the chamber, supporting the fact that conventional techniques for forming BPSG layers result in non-uniform distribution of B.

Example 3

Figure 12A:
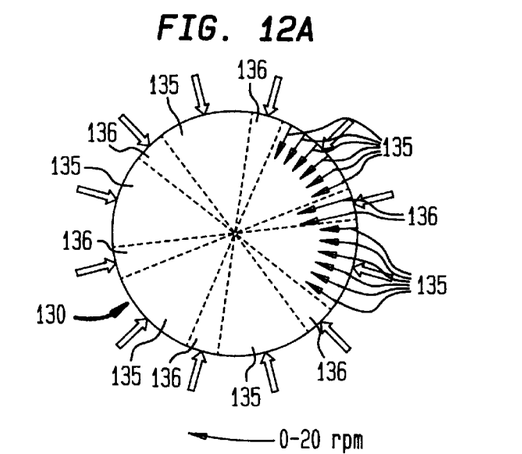
FIGS. 12a–c show the TEB/TEOS ratio of a BPSG produced by simulation using a model of a segmented chemistry delivery system having shortened diffusion path for one of the chemistries.

A theoretical gas flow simulation for forming a BPSG layer with shortened diffusion path for the TEB/TEOS/O$_2$/N$_2$ chemistry was also performed on Phoenics CVD 2.1. Referring to FIG. 12a, a model 130 of the reaction chamber is shown. The model comprises twelve sectors 135 and 136, with alternating sectors 135 being larger. TEB/TEOS/O$_2$/N$_2$ and PH$_3$/O$_2$/N$_2$ chemistries are flowed into alternating sectors 135 and 136, respectively, of the reaction chamber. As shown, the TEB/TEOS/O$_2$/N$_2$ sectors are about 45° and the PH$_3$/O$_2$/N$_2$ sectors are about 15°.

The following are the process parameters used in the simulation:

| | |
|---|---|
| Pressure in reaction chamber | 1 Torr |
| Temperature in reaction chamber | 830° C. |
| Rotation rate of susceptor | 3.5 rpm |
| TEOS/TEB injection | 3.75 slm N$_2$ |
| | 10.725 ml/min TEOS |
| | 2.775 ml/min TEB |
| PH$_3$ injector | 4.17 slm N$_2$ |
| TEOS diffusivity | 1.1 × 10$^{-2}$ m$^2$/sec |
| TEB diffusivity | 1.6 × 10$^{-2}$ m$^2$/sec |

Figure 12B:
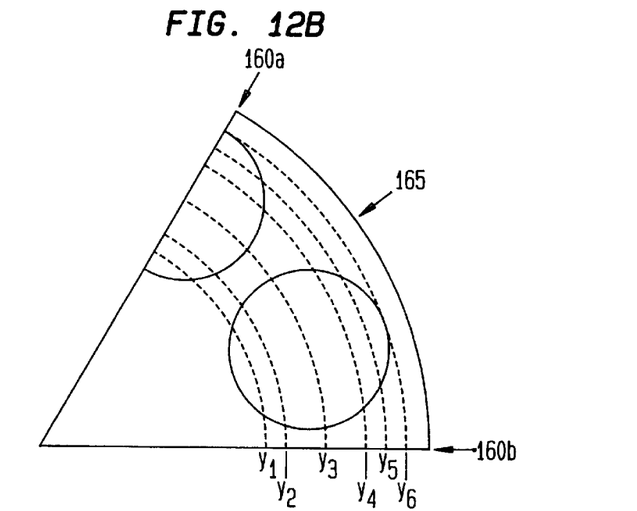

FIG. 12b shows a 60° segment of the reaction chamber in greater detail. Injector 160a–b are used to flow TEB/TEOS/O$_2$/N$_2$ chemistry and injector 165 is used to flow PH$_3$/O$_2$/N$_2$ chemistry. As shown, arcs y1–y6 represent different radial positions of the reaction chamber.

Figure 12C:
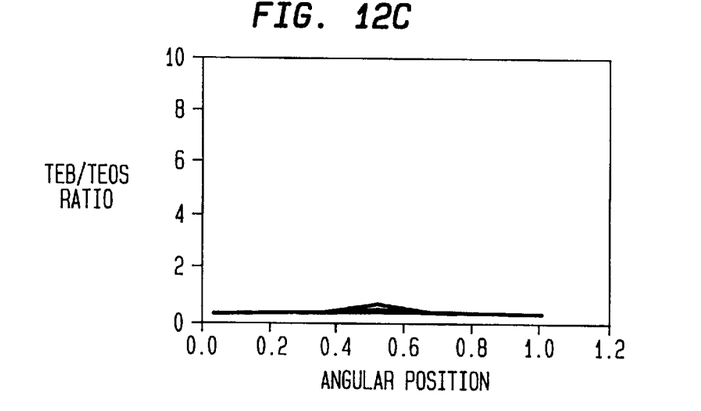

TEB/TEOS ratios were measured in different spatial positions of the reactor. Referring to FIG. 12c, the TEB/TEOS ratio is plotted as a function of angular position. Lines 1–6 correspond to the arcs y1–y6 in FIG. 12b. As indicated by lines 1–6, the TEB/TEOS ratio remains fairly constant at different as the radial position, with an increase from the center to the circumference of the chamber of < about 1, suggesting more uniformity in the concentration of B across the wafer. Thus, from example 3, shortening the diffusion path of the TEB/TEOS/O$_2$/N$_2$ chemistry improves the uniformity of the B distribution in the BPSG layer.

Example 4

A deposition experiment was performed to measure the impact of O$_2$ on the distribution of B dopants. In order to isolate the effect of O$_2$, the experiment was conducted by forming BSG. That is, only TEB/TEOS/O$_2$/N$_2$ chemistry was flowed through the injectors.

Figure 13A:
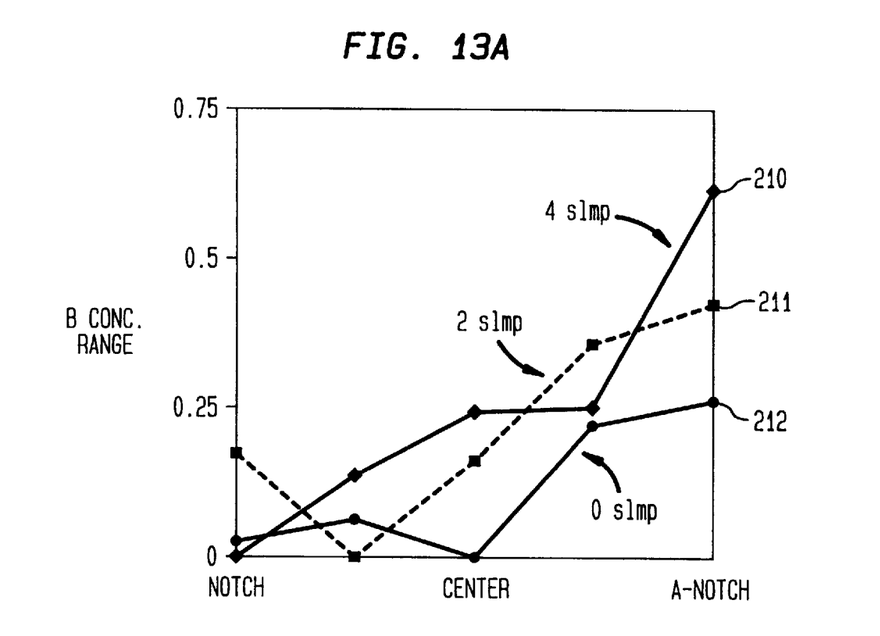
FIGS. 13a–b show the impact of oxygen flow on the uniformity of B dopants.
Figure 13B:
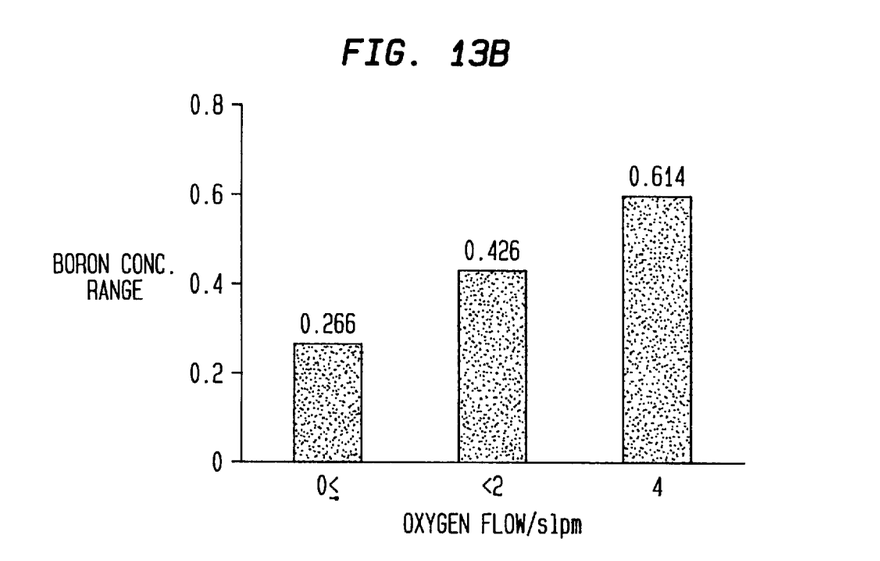

Referring to FIG. 13a, a plot of the B concentration measurements as a function of wafer location is shown. Lines 210, 211, and 212 are measurements from wafers formed with O$_2$ flow rate of 4, 2, and 0 slpm, respectively. The plot shows that decreasing the flow rate Of O$_2$ improves the uniformity of distribution B concentration in the wafer. FIG. 13b is a graph of the difference of B concentration from the notch to anti-notch portion of a wafer. As shown, O$_2$ flow rate of 4 slpm results in a 0.614 wt % difference in B concentration from the notch to anti-notch position. O$_2$ flow rate of 2 slpm shows a difference of 0.426 wt % from the notch to anti-notch position and O$_2$ flow rate of 0 slpm shows a difference of 0.266 wt % from the notch to anti-notch position. Thus, flowing the flow rate of O$_2$ results in improved uniformity of B. From the results of this experiment, one can logically conclude that O$_2$ will have a similar impact on B uniformity in the formation of BPSG.

While the invention has been particularly shown and described with reference to various embodiments, it will be recognized by those skilled in the art that modifications and changes may be made to the present invention without departing from its scope. The scope of the invention should therefore be determined not with reference to the above description but with reference to the appended claims along with their full scope of equivalents.

We claim:

1. In device fabrication, a method for forming a multi-constituent device layer on a wafer surface, the device layer comprising first and second constituents is being formed in a reaction chamber comprising a susceptor capable of supporting at least one wafer and alternating first and second segments, the method comprising:

providing at least one wafer on the susceptor;
rotating the susceptor;
flowing a first chemistry comprising the first constituent into the first segments of the reaction chamber;
flowing a second chemistry comprising the second constituent into the second segments of the reaction chamber; and
wherein the first segments comprise an area that is greater than an area of the second segments by an amount sufficient to effectively reduce a diffusion path of the first constituent to result in a more uniform distribution of the first constituent within the layer.

2. The method as recited in claim 1 wherein the amount by which the area of the first segments is greater than the area of the second segments is at least about 20%.

3. The method as recited in claim 1 wherein the amount by which the area of the first segments is greater than the area of the second segments ranges between about 20–400%.

4. The method as recited in claim 1 wherein the amount by which the area of the first segments is greater than the area of the second segments ranges between about 40–350%.

5. The method as recited in claim 1 wherein the amount by which the area of the first segments is greater than the area of the second segments by ranges between about 60–300%.

6. The method as recited in claim 1 wherein the amount by which the area of the first segments is greater than the area of the second segments ranges between about 100–200%.

7. The method as recited in claim 1 wherein a variance of the first constituent within the layer is ≦ about 0.75 wt %.

8. The method as recited in claim 1 wherein a variance of the first constituent within the layer is ≦ about 0.6 wt %.

9. The method as recited in claim 1 wherein a variance of the first constituent within the layer is ≦ about 0.5 wt %.

10. The method as recited in claim 1 wherein the reaction chamber comprises at least 2 first segments and at least 2 second segments.

11. The method as recited in claim 1 wherein the reaction chamber comprises at least 3 first segments and at least 3 second segments.

12. The method as recited in claim 1 wherein the reaction chamber comprises 6 first segments and 6 second segments.

13. The method as recited in claim 12 wherein the area of the first segments ranges between about 35°–55°.

14. The method as recited in claim 12 wherein the area of the second segments ranges between about 15°–25°.

15. The method as recited in claim 12 wherein the area of the first segments ranges between about 40°–50°.

16. The method as recited in claim 12 wherein the area of the second segments ranges between about 10°–20°.

17. The method as recited in claim 12 wherein the area of the first segments is about 45°.

18. The method as recited in claim 12 wherein the area of the second segments is about 15°.

19. The method as recited in claim 1 wherein the layer comprises BPSG.

20. The method as recited in claim 19 wherein the first chemistry comprises TEB and the second chemistry comprises $PH_3$.

21. The method as recited in claim 20 wherein the first chemistry further comprises TEOS.

22. The method as recited in claim 21 wherein the first chemistry further comprises oxygen and nitrogen.

23. The method as recited in claim 20 wherein the second chemistry further comprises oxygen and nitrogen.

24. The method as recited in claim 21 wherein the amount by which the area of the first segments is greater than the area of the second segments is at least about 20%.

25. The method as recited in claim 21 wherein the amount by which the area of the first segments is greater than the area of the second segments ranges between about 20–400%.

26. The method as recited in claim 21 wherein the amount by which the area of the first segments is greater than the area of the second segments ranges between about 40–350%.

27. The method as recited in claim 21 wherein the amount by which the area of the first segments is greater than the area of the second segments ranges between about 60–300%.

28. The method as recited in claim 21 wherein the amount by which the area of the first segments is greater than the area of the second segments ranges between about 100–200%.

* * * * *